（12） United States Patent
Kondou et al.

(10) Patent No.: US 7,078,953 B2
(45) Date of Patent: Jul. 18, 2006

(54) LEVEL DOWN CONVERTER

(75) Inventors: Masafumi Kondou, Sapporo (JP);
Toshihiko Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 18 days.

(21) Appl. No.: 10/870,913

(22) Filed: Jun. 21, 2004

(65) Prior Publication Data
US 2005/0035807 A1   Feb. 17, 2005

(30) Foreign Application Priority Data
Aug. 14, 2003   (JP) .............................. 2003-293568

(51) Int. Cl.
*H03L 5/00*   (2006.01)
(52) U.S. Cl. ........................... 327/333; 326/68; 326/81
(58) Field of Classification Search ................ 327/333; 326/68, 80, 81
See application file for complete search history.

(56) References Cited

U.S. PATENT DOCUMENTS 5,200,921 A * 4/1993 Okajima ................ 365/189.11
6,166,580 A * 12/2000 Sessions ..................... 327/333

FOREIGN PATENT DOCUMENTS

JP          2002246893 A       8/2002

* cited by examiner

*Primary Examiner*—Long Nguyen
(74) *Attorney, Agent, or Firm*—Arent Fox, PLLC

(57) ABSTRACT

A level down converter having a first inverter supplied a first power supply voltage, and outputting signals made by logical inversions of input signals, and a second inverter supplied a second power supply voltage being lower than the first power supply voltage, and outputting signals made by logical inversions of output signals from the first inverter, is provided. The first inverter contains a transistor including a gate insulation film having a first film thickness. The second inverter contains a transistor including a gate insulation film having a second film thickness which is thinner than the first film thickness.

19 Claims, 7 Drawing Sheets

F I G. 1
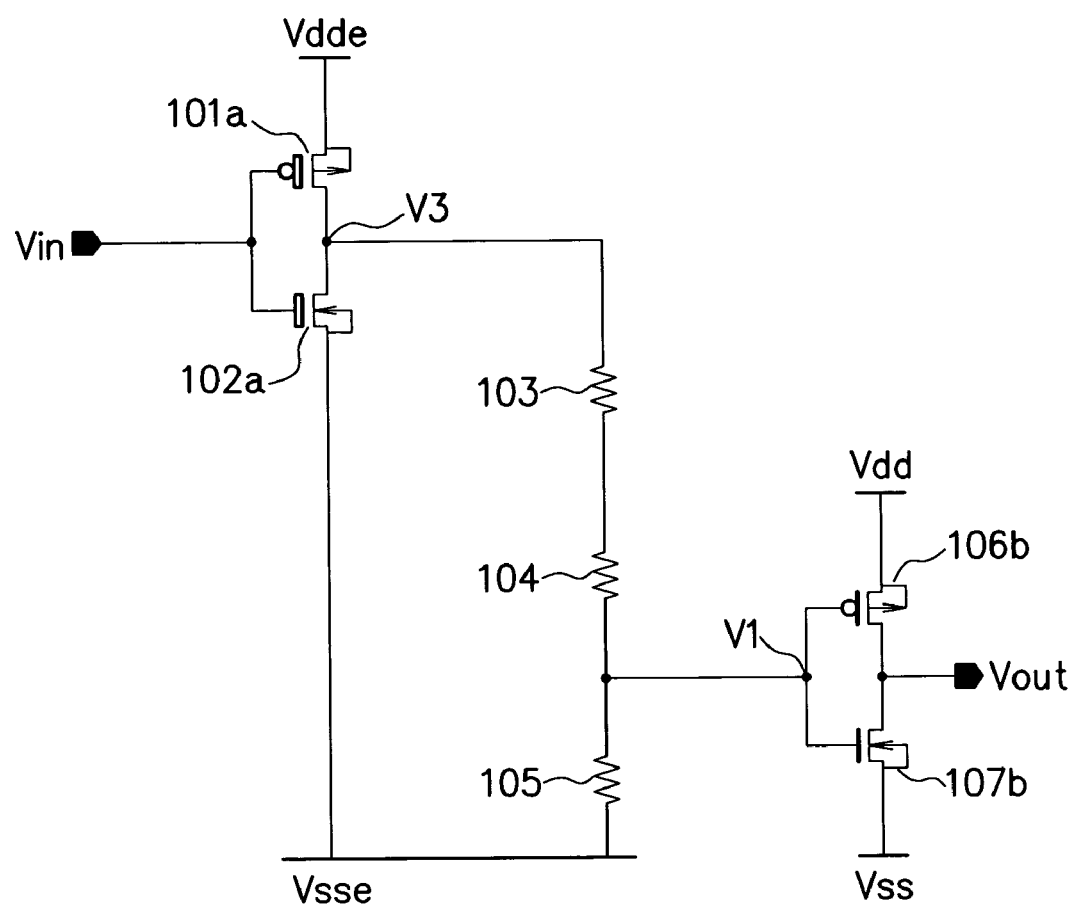

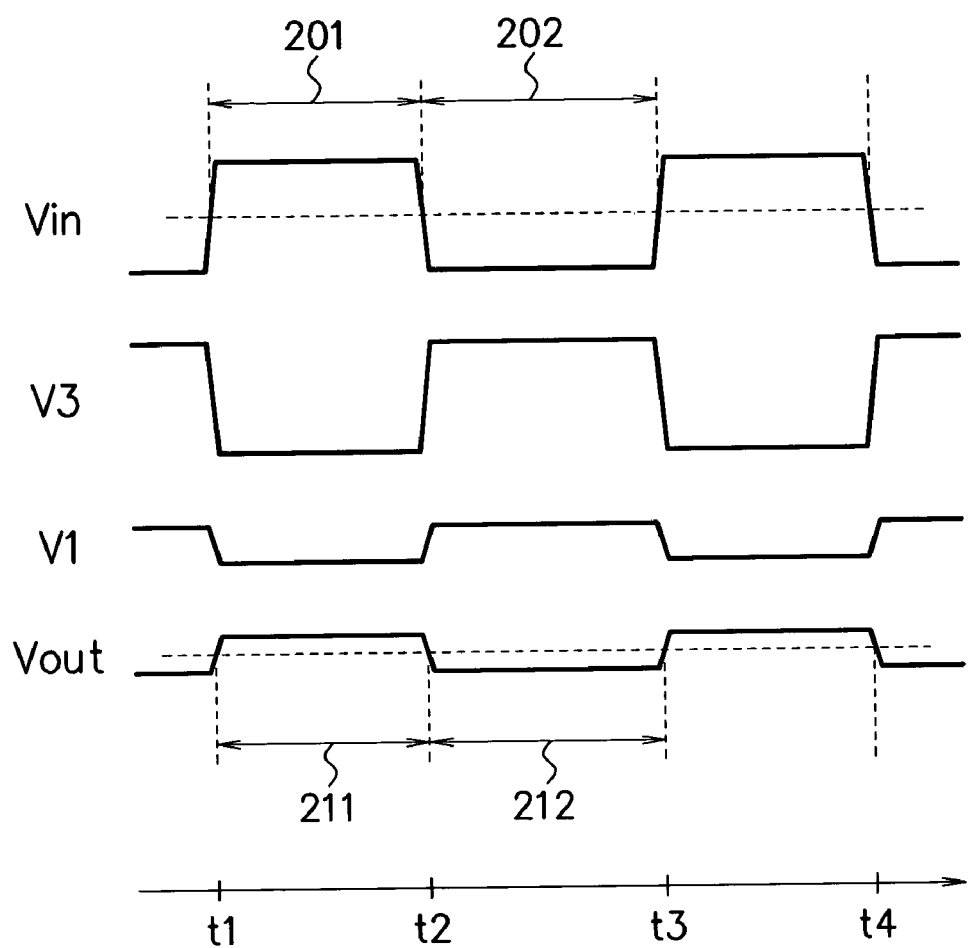

F I G. 3A
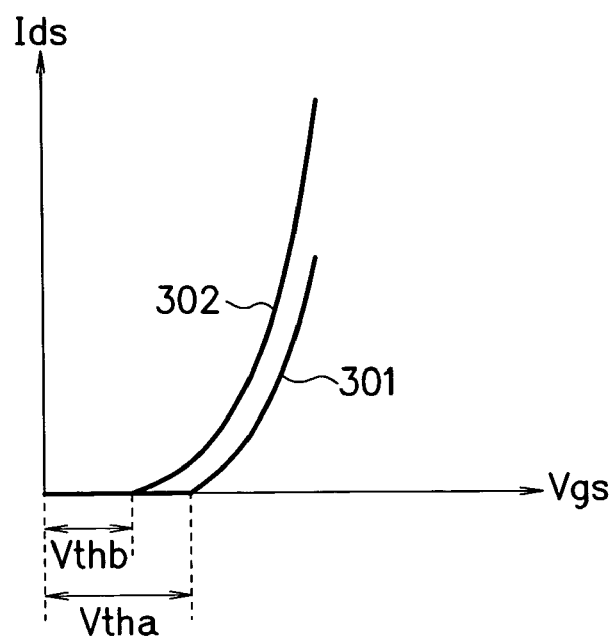
F I G. 3B
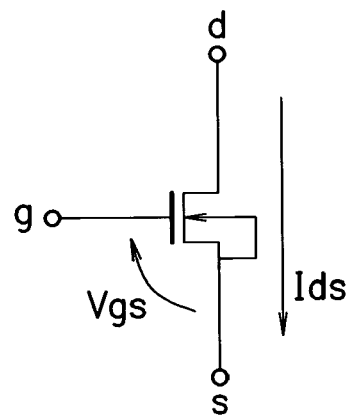
F I G. 3C
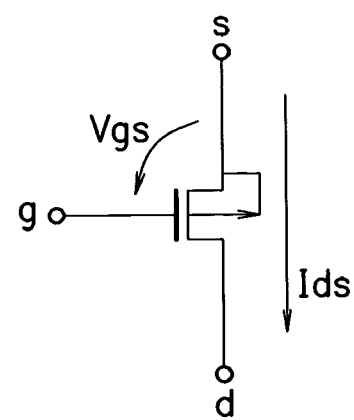

| Vin | V3 | AUXILIARY VOLTAGE DIVIDING TRANSISTOR | V1 |
|---|---|---|---|
| 0V | 3.3V | off | 1.1V |
| 3.3V | 0V | on | 0V |

LEVEL DOWN CONVERTER

CROSS-REFERENCE TO RELATED APPLICATIONS

This application is based upon and claims the benefit of priority from the prior Japanese Patent Application No. 2003-293568, filed on Aug. 14, 2003, the entire contents of which are incorporated herein by reference.

BACKGROUND OF THE INVENTION

1. Field of the Invention

The present invention relates to a level down converter, especially having two inverters.

2. Description of the Related Art

Conventionally, attempts have been done to have internal circuits operate with a low power supply voltage, to reduce the power consumption of semiconductor integrated circuits, while maintaining the voltage level of input/output signals with external. In such semiconductor integrated circuits, a level down converter, with inverters which consist of thick oxide film transistors having thick gate oxide films on input portions thereof, is provided.

FIG. 7 is a view which shows circuits of a level down converter according to a prior art. A front stage inverter has MOS field effect transistors 701a and 702a, and a rear stage inverter has MOS field effect transistors 703a and 704a. Hereinafter, these MOS field effect transistors will be referred to as MOS transistors.

At first, the front stage inverter is described hereafter. To an input terminal Vin, a gate of a p-channel MOS transistor 701a and a gate of a n-channel MOS transistor 702a are connected. A source of the p-channel MOS transistor 701a is connected to a high power supply voltage Vdde (for example, 3.3 V), and a drain thereof is connected to a node V2. A source of the n-channel MOS transistor 702a is connected to a reference potential Vsse (for example, 0 (zero) V), and a drain thereof is connected to the node V2. This front stage inverter, as shown in FIG. 8, inputs digital signals (for example, clock signals) of, for example, from 0 (zero) V to 3.3 V, which are inputted to the input terminal Vin, and outputs signals which are made by logical inversions of the signals to the node V2. The signals of the node V2 are also signals of, for example, from 0 (zero) V to 3.3 V.

Operations of the front stage inverter are described. When the input terminal Vin is in low level (0 V), (during the times t2 to t3), the p-channel MOS transistor 701a is turned on, and the n-channel MOS transistor 702a is turned off. As a result, the node V2 becomes high level (3.3 V). On the contrary, when the input terminal Vin is in high level (3.3 V) (during the times t1 to t2, and t3 to t4), the p-channel MOS transistor 701a is turned off, and the n-channel MOS transistor 702a is turned on. As a result, the node V2 becomes low level (0 V).

Next, the rear stage inverter is described hereafter. To the node V2, a gate of a p-channel MOS transistor 703a and a gate of a n-channel MOS transistor 704a are connected. A source of the p-channel MOS transistor 703a is connected to a low power supply voltage Vdd (for example, 1.2 V), and a drain thereof is connected to an output terminal Vout. A source of the n-channel MOS transistor 704a is connected to a reference potential Vss (for example, 0 (zero) V), and a drain thereof is connected to the output terminal Vout. This rear stage inverter, as shown in FIG. 8, inputs digital signals of the node V2 of, for example, from 0 (zero) V to 3.3 V, and outputs signals which are made by logical inversions of the signals to the output terminal Vout. The signals of the output terminal Vout are signals of, for example, from 0 V to 1.2 V. The start-up speed of this signals of the output terminal Vout becomes slow. The reason will be described later.

Operations of the rear stage inverter are described. When the node V2 is in low level (0 V)(during the times t1 to t2, and t3 to t4), the p-channel MOS transistor 703a is turned on, and the n-channel MOS transistor 704a is turned off. As a result, the output terminal Vout becomes high level (1.2 V). On the contrary, when the node V2 is in high level (3.3 V)(during the times t2 to t3), the p-channel MOS transistor 703a is turned off, and the n-channel MOS transistor 704a is turned on. As a result, the output terminal Vout becomes low level (0 V).

The power supply voltage Vdde (3.3 V) of the front stage inverter is high, and the power supply voltage Vdd (1.2 V) of the rear stage inverter is low. Digital signals from 0 V to 3.3 V are inputted to the input terminal Vin, so the gate oxide films of the MOS transistors 701a and 702a are required to be thick, in order to prevent the gate oxide films of the MOS transistors 701a and 702a from being broken.

And signals of the node V2 are also from 0 V to 3.3 V, so the gate oxide films of the MOS transistors 703a and 704a are required to be thick, in order to prevent the gate oxide films of the MOS transistors 703a and 704a from being broken.

A level down converter capable of preventing the decrease of an operating speed, and reducing power consumption by reducing the increase of through currents is described in Japanese Patent Application Laid-open No. 2002-246893.

As shown in FIG. 8, the reason why the start-up speed of signals of the output terminal Vout becomes slow, is described. When the p-channel MOS transistor 703a is applied 0 (zero) V to the gate thereof, the transistor 703a is turned on, and the current Ids flows between the source and the drain thereof. This current Ids becomes large as the absolute value of the voltage Vgs of the gate to the source thereof becomes high. When the gate is applied 0 (zero) V, the voltage Vgs becomes −1.2 V.

It is also required to consider a threshold voltage of the transistor 703a. In the transistor 703a, the current Ids flows when the voltage Vgs is on or less than a negative threshold voltage. So actually, the current Ids flows in accordance with the voltage which is found by subtracting the negative threshold voltage from the voltage Vgs (−1.2 V). To be more specific, as the absolute value of the threshold voltage becomes low, a large current Ids flows. The absolute value of the threshold voltage of a transistor having a thick gate oxide film is high compared to that of a transistor having a thin gate oxide film. Therefore, the current Ids becomes small, and the operation speed of the transistor 703a becomes slow. As a result, the start-up speed of the output terminal Vout in FIG. 8 becomes slow. To be more specific, the transition time of the output terminal Vout to change the voltage from 0 (zero) V to 1.2 V becomes slow.

On the contrary, the start-down speed of the output terminal Vout does not become slow. When a n-channel MOS transistor 704a is applied 3.3 V to a gate thereof, the transistor 704a is turned on, and the current Ids flows between a drain and a source thereof. This current Ids becomes large as the voltage Vgs of the gate to the source becomes high. When the gate is applied 3.3 V, the voltage Vgs becomes high voltage of 3.3 V. As the voltage Vgs is a high voltage, the current Ids becomes large, and the operation speed of the transistor 704a becomes fast. As the turn-on operation speed of the transistor 704*a* is fast, the start-down speed of the output terminal Vout in FIG. 8 becomes fast. To be more specific, the transition time of the output terminal Vout to change the voltage from 1.2 V to 0 (zero) V becomes fast.

As the start-up speed of the signals of the output terminal Vout becomes slow, the duty ratio deteriorates. To be more specific, a high level period 811 of the output terminal Vout becomes short compared to a high level period 801 of the input terminal Vin, and a low level period 812 of the output terminal Vout becomes long compared to a low level period 802 of the input terminal Vin.

Either high level or low level of the signals of the output terminal Vout is determined by a threshold value 810 as a basis. The output signals have the slow start-up speed, so the transition timing from low level to high level is sensitive and easy to be shifted. The reason for this is because the absolute value of the voltage Vgs which is applied to the p-channel MOS transistor 703*a* is low, so it operates in the sub-threshold region, and the characteristic becomes unstable. When a characteristic dispersion between the p-channel MOS transistor and the n-channel MOS transistor is large, the duty ratio of the output signals tends to be deteriorated. And, when noise on the power supply or on the ground is generated, the output signals tend to be deteriorated.

When high frequency clock signals are inputted to the input terminal Vin, the p-channel MOS transistor 703*a* has the slow operation speed, therefore clock signals can not be outputted or the duty ratio of output clock signals may be deteriorated. When the power supply voltage Vdd becomes lower, level conversions of signals become hard.

SUMMARY OF THE INVENTION

An object of the present invention is to provide a level down converter in which operations in high frequency environment is possible even when a power supply voltage Vdd is low, and the effect of a characteristic dispersion between a p-channel MOS transistor and a n-channel MOS transistor is small.

According to an aspect of the present invention, a level down converter having a first inverter supplied a first power supply voltage, and outputting signals made by logical inversions of input signals, and a second inverter supplied a second power supply voltage being lower than the first power supply voltage, and outputting signals which are made by logical inversions of output signals from the first inverter, is provided. The first inverter contains a transistor which has a gate insulation film having a first film thickness. The second inverter contains a transistor including a gate insulation film having a second film thickness which is thinner than the first film thickness.

BRIEF DESCRIPTION OF THE DRAWINGS

FIG. 1 is a circuit diagram which shows a configuration example of a level down converter in a first embodiment according to the present invention;

FIG. 2 is a timing chart which describes operations of the level down converter in the first embodiment;

FIG. 3A is a graph which shows voltage current characteristics of a n-channel MOS transistor;

FIG. 3B is a view which shows a n-channel MOS transistor;

FIG. 3C is a view which shows a p-channel MOS transistor;

DETAILED DESCRIPTION OF THE PREFERRED EMBODIMENTS

First Embodiment

Figure 4A:
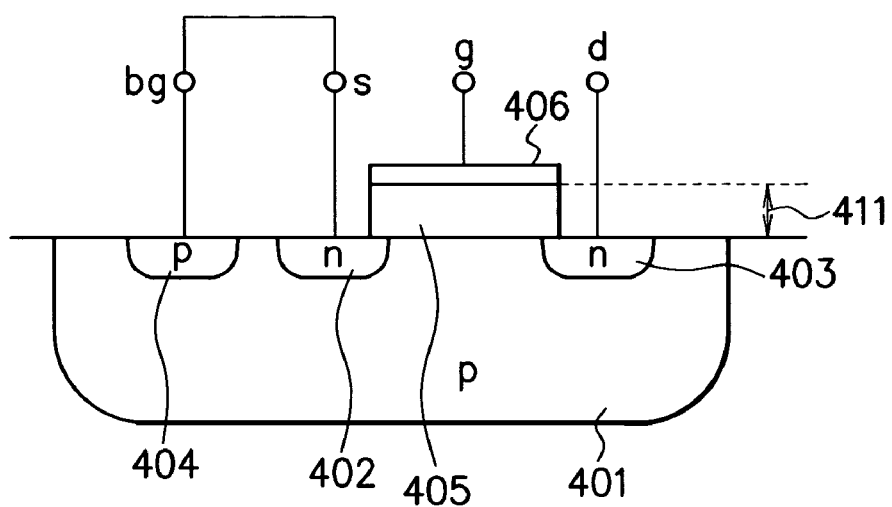
FIG. 4A is a sectional view which shows a constructional example of a n-channel MOS transistor which has a thick gate insulation film.

FIG. 1 is a circuit diagram which shows a configuration example of a level down converter in a first embodiment according to the present invention. A front stage inverter has MOS field effect transistors 101*a* and 102*a*, and a rear stage inverter has MOS field effect transistors 106*b* and 107*b*. Hereinafter, these MOS field effect transistors will be referred to as MOS transistors.

The MOS transistors 101*a* and 102*a* are transistors, each of which has a gate oxide film (gate insulation film) having a thick thickness. On the contrary, the MOS transistors 106*b* and 107*b* are transistors, each of which has a gate oxide film (gate insulation film) having a thin thickness. Resistances 103 to 105 are voltage dividing circuit to divide a voltage of a terminal V3 and supply it to the terminal V1.

At first, the front stage inverter is described hereafter. A gate of a p-channel MOS transistor 101*a* and a gate of a n-channel MOS transistor 102*a* are connected to an input terminal Vin. A source of the p-channel MOS transistor 101*a* is connected to a high power supply voltage Vdde (for example, 3.3 V), and a drain thereof is connected to the output terminal V3. A source of the n-channel MOS transistor 102*a* is connected to a reference potential Vsse (for example, 0 (zero) V), and a drain thereof is connected to the output terminal V3. This front stage inverter, as shown in FIG. 2, inputs digital signals (for example, clock signals) of, for example, from 0 (zero) V to 3.3 V, which are inputted to the input terminal Vin, and outputs signals, which are made by a logical inversion, to the output terminal V3. The signals of the output terminal V3 are also the signals of, for example, from 0 (zero) V to 3.3 V.

Operations of the front stage inverter are described. When the input terminal Vin is in low level (0 V) (during the times t2 to t3), the p-channel MOS transistor 101*a* is turned on, and the n-channel MOS transistor 102*a* is turned off. As a result, the output terminal V3 becomes high level (3.3 V). On the contrary, when the input terminal Vin is in high level (3.3 V) (during the times t1 to t2, and t3 to t4), the p-channel MOS transistor 101*a* is turned off, and the n-channel MOS transistor 102*a* is turned on. As a result, the output terminal V3 becomes low level (0 V).

The three resistances 103 to 105 are serially connected between the output terminal V3 and the reference potential Vsse. The input terminal V1 is connected to the node of the interconnection point for the resistances 104 and 105. A resistance-divided voltage of the voltage of the output terminal V3 is applied to the input terminal V1. When all of the three resistances 103 to 105 have the same resistance value, the voltage of the input terminal V1 becomes one-third of the voltage of the output terminal V3. The voltage of the output terminal V3 is from 0 V to 3.3 V, and the voltage of the input terminal V1 is from 0 V to 1.1 V. The resistances 103 to 105 include a diffused resistor, a polysilicon resistor, a metal resistor, and so on.

The power supply voltage Vdd of 1.2 V is supplied to the transistors 106b and 107b, therefore the voltage of the input terminal V1 which is connected to the gates of the transistors 106b and 107b, is preferable to be divided into a resistance to be on or less than the power supply voltage Vdd. The gate oxide films of the transistors 106b and 107b are thin, so the gate oxide films will be broken because of the high voltage without the resistances 103 to 105. Therefore, the voltage of the input terminal V1 is required to be divided by the resistances 103 to 105 to decrease the voltage.

Next, the rear stage inverter is described hereafter. A gate of a p-channel MOS transistor 106b and a gate of a n-channel MOS transistor 107b are connected to the input terminal V1. A source of the p-channel MOS transistor 106b is connected to a low power supply voltage Vdd (for example, 1.2 V), and a drain thereof is connected to an output terminal Vout. A source of the n-channel MOS transistor 107b is connected to a reference potential Vss (for example, 0 (zero) V), and a drain thereof is connected to the output terminal Vout. This rear stage inverter, as shown in FIG. 2, inputs signals (from 0 V to 1.1 V) of the input terminal V1, and outputs signals which are made by a logical inversion to the output terminal Vout. The signals of the output terminal Vout are signals of, for example, from 0 V to 1.2 V.

Operations of the rear stage inverter are described. When the input terminal V1 is in low level (0 V) (during the times t1 to t2, and t3 to t4), the p-channel MOS transistor 106b is turned on, and the n-channel MOS transistor 107b is turned off. As a result, the output terminal Vout becomes high level (1.2 V). On the contrary, when the input terminal V1 is in high level (1.1 V) (during the times t2 to t3), the p-channel MOS transistor 106b is turned off, and the n-channel MOS transistor 107b is turned on. As a result, the output terminal Vout becomes low level (0 V).

This level down converter can make level down conversions from 3.3 V power supply input signals to 1.2 V power supply signals, and output them. To be more specific, signals of the input terminal Vin are signals from 0 (zero) V to 3.3 V, and signals of the output terminal Vout are signals from 0 (zero) V to 1.2 V.

The power supply voltage Vdde (3.3 V) of the front stage inverter is high, and the power supply voltage Vdd (1.2 V) of the rear stage inverter is low. Signals from 0 V to 3.3 V are inputted to the input terminal Vin, so the gate oxide films of the MOS transistors 101a and 102a are required to be thick, in order to prevent the gate oxide films of the MOS transistors 101a and 102a from being broken.

On the contrary, by reducing the thickness of the gate oxide films of the transistors 106b and 107b, the operating speed of the rear stage inverter can increase. The reason will be described hereinafter. As shown in FIG. 3B, a n-channel MOS transistor has a gate "g", a source "s", and a drain "d". A current Ids which flows from the drain "d" to the source "s", depends on a voltage Vgs of the gate "g" to the source "s".

In FIG. 3A, voltage Vgs—current Ids characteristics 301 and 302 are shown. The characteristic 301 is a characteristic of a n-channel MOS transistor which has a gate oxide film having a thick thickness. The characteristic 302 is a characteristic of the n-channel MOS transistor which has a gate oxide film having a thin thickness. As a voltage Vgs becomes high, a current Ids becomes large. Threshold voltages Vtha and Vthb are values of the voltage Vgs when the current Ids begins to flow. The threshold voltage Vtha is a threshold voltage of a transistor which has a gate oxide film having a thick thickness, and the voltage thereof is high. The threshold voltage Vthb is a threshold voltage of a transistor which has a gate oxide film having a thin thickness, and the voltage thereof is low. For example, when the gate "g" of the transistor 107b is 0 (zero) V (in low level), the voltage Vgs is 0 (zero) V and the current Ids does not flow. On the contrary, when the gate "g" of the transistor 107b is 1.1 V (in high level), the voltage Vgs is 1.1 V and the current Ids flows.

A relational expression between a threshold voltage Vth of a transistor and a film thickness $t_{ox}$ of a gate oxide film (an insulation film) can be expressed by the following expression. Here, "q" is an electric charge of an electron, $N_A$ is an acceptor concentration, $L_{Dm}$ is a maximum width of a depletion layer, and $\epsilon_{ox}$ is a relative dielectric constant of the gate oxide film (the insulation film).

$$Vth = 2\phi_F + \frac{qN_A L_{Dm}}{\varepsilon_0 \varepsilon_{ox}} \times t_{ox} \quad \text{[Expression 1]}$$

As described above, as the film thickness $t_{ox}$ of the gate oxide film is thick, the threshold voltage Vth of the transistor becomes high. To be more specific, when the film thickness $t_{ox}$ of the gate oxide film is thick, the threshold voltage Vtha of the transistor becomes high, and the film thickness $t_{ox}$ of the gate oxide film is thin, the threshold voltage Vthb of the transistor becomes low. For example, the film thickness of the gate oxide films of the MOS transistors 101a and 102a are thick as 8 nm, and the threshold voltage Vtha is high as 0.7 V. The film thickness of the gate oxide films of the MOS transistors 106b and 107b are thin as 3 nm, and the threshold voltage Vthb is low as 0.3 V.

Further, as shown in FIG. 3C, a p-channel MOS transistor has a gate "g", a source "s", and a drain "d". A current Ids which flows from the source "s" to the drain "d", depends on a voltage Vgs of the gate "g" to the source "s". However, the voltage Vgs of the horizontal axis in FIG. 3A, becomes lower in accordance with it goes to the right, because the positive and negative sign is reversed. For example, when the gate "g" of the transistor 106b is 1.1 V (in high level), the voltage Vgs is −0.1 V, and the current Ids does not flow. On the contrary, when the gate "g" of the transistor 106b is 0 (zero) V (in low level), the voltage Vgs is −1.2 V, and the current Ids flows.

Figures 6, 7:
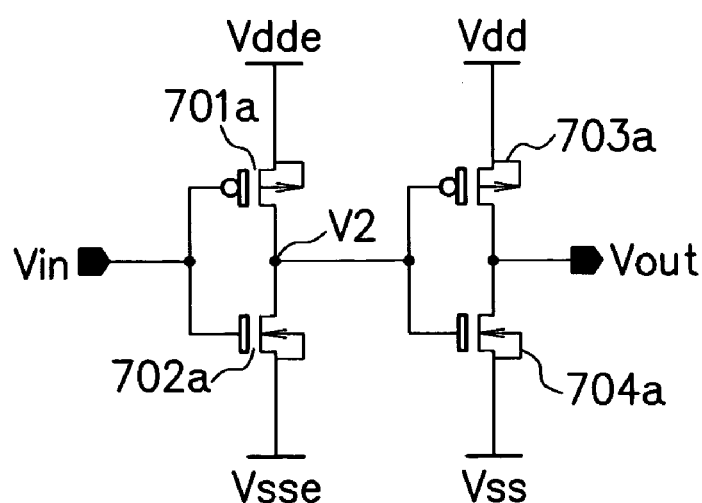
FIG. 6 is a view which describes operations of the level down converter of the second embodiment.
FIG. 7 is a circuit diagram of a level down converter of a prior art.
Figure 8:
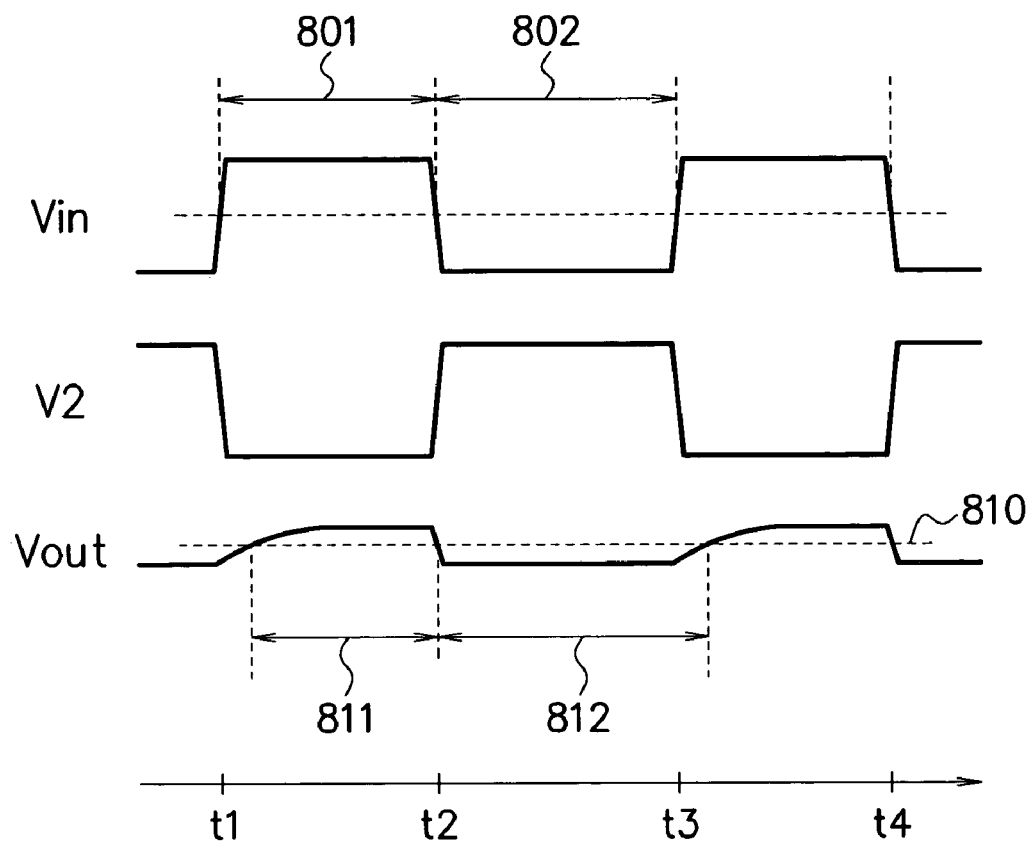
FIG. 8 is a timing chart which describes operations of the level down converter.

In a level down converter in FIG. 7, when a p-channel MOS transistor 703a is applied 0 (zero) V to a gate thereof, a voltage Vgs becomes −1.2 V. And, an absolute value of a threshold voltage Vtha is high, because the transistor 703a has a thick gate oxide film. Accordingly, as shown in the characteristic 301 in FIG. 3A, the current Ids becomes small, and the turn-on operation speed of the transistor 703a becomes slow. As a result, as shown in FIG. 8, a start-up speed of an output terminal Vout becomes slow.

According to the present embodiment in FIG. 1, when the p-channel MOS transistor 106b is applied 0 (zero) V to the gate thereof, the voltage Vgs becomes −1.2 V. The absolute value of the threshold voltage Vthb is low, because the transistor 106b has the thin gate oxide film. Therefore, as shown in the characteristic 302, the current Ids becomes large, and the turn-on operation speed of the transistor 106b becomes fast. As a result, as shown in FIG. 2, the start-up speed of the output terminal Vout becomes fast.

As signals of the output terminal Vout have the fast start-up speed, the deterioration of the duty ratio can be restrained. To be more specific, a high level period 211 of the output terminal Vout becomes almost the same as a high level period 201 of the input terminal Vin, and a low level period 212 of the output terminal Vout becomes almost the same as a low level period 202 of the input terminal Vin.

Similarly, the n-channel MOS transistor 107b also has the thin gate insulation film, therefore the threshold voltage Vthb is low, and the operation speed thereof is fast. As a result, a start-down speed of the output terminal Vout in FIG. 2 becomes fast.

Besides, the signals of the output terminal Vout have the fast start-up speed, so the transition timing from low level to high level resists shifting. The reason for this is because the p-channel MOS transistor 106b has a large operation current Ids, and the characteristic is stable. Even when a characteristic dispersion between the p-channel MOS transistor and the n-channel MOS transistor is large, the deterioration of the duty ratio of the output signals can be restrained. Or, even when noise on the power supply or on the ground is generated, the deterioration of the output signals can be restrained.

When high frequency clock signals are inputted to the input terminal Vin, stable clock signals can be outputted and the deterioration of the duty ratio of output clock signals can be restrained, because the p-channel MOS transistor 106b has the fast operation speed. And, even when the power supply voltage Vdd becomes lower, level conversions of signals are possible.

FIG. 4A is a sectional view which shows a constructional example of a n-channel MOS transistor 102a which has a thick gate insulation film. A p-type well 401 is formed on a silicon substrate. Inside of the p-type well 401, a n-type source region 402 and a n-type drain region 403 is formed. A gate insulation film 405 is formed on a channel region between the source region 402 and the drain region 403. The gate insulation film 405 is, for example, a gate oxide film (a silicon oxide film). A gate electrode 406 is, for example, a polysilicon, and is formed on the gate insulation film 405. A gate terminal "g" is connected to the gate electrode 406, a source terminal "s" is connected to the source region 402, and a drain terminal "d" is connected to the drain region 403. The p-type well 401 is a back gate, and it is connected to a back gate terminal "bg" through a p-type region 404. By connecting the back gate terminal "bg" and the source terminal "s", the back gate and the source can be connected. A film thickness 411 of the gate insulation film 405 is relatively thick. The p-channel MOS transistor 101a has a reversed conductivity type of a semiconductor compared to the n-channel MOS transistor 102a in FIG. 4A. That is to say, the p-type and the n-type are mutually-reversed.

Figure 4B:
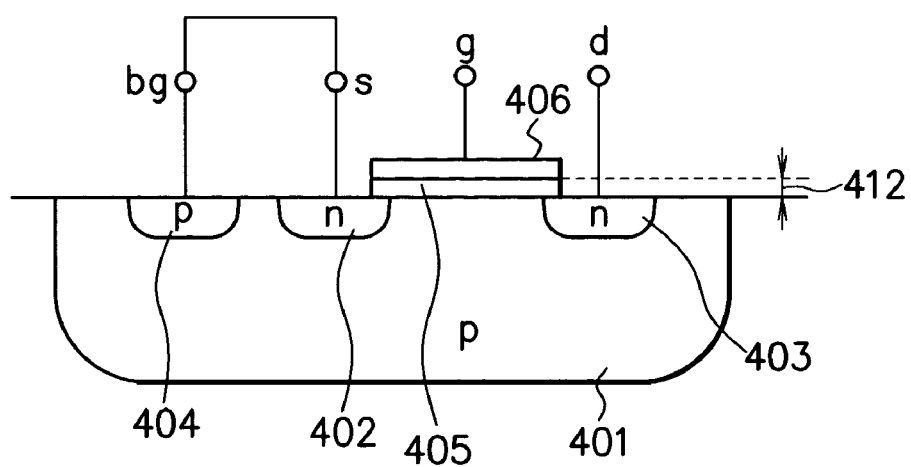
FIG. 4B is a sectional view which shows a constructional example of a n-channel MOS transistor which has a thin gate insulation film.

FIG. 4B is a sectional view which shows a constructional example of a n-channel MOS transistor 107b having a thin gate insulation film. This transistor 107b has a thinner film thickness 412 of the gate insulation film 405, than the film thickness 411 of the gate insulation film 405 of the transistor 102a in FIG. 4A. In other points, the transistors 107b and 102a are the same. As the same as described above, the p-channel MOS transistor 106b has a reversed conductivity type of a semiconductor compared to the n-channel MOS transistor 107b in FIG. 4B, and the p-type and the n-type are mutually-reversed.

Second Embodiment

Figure 5:
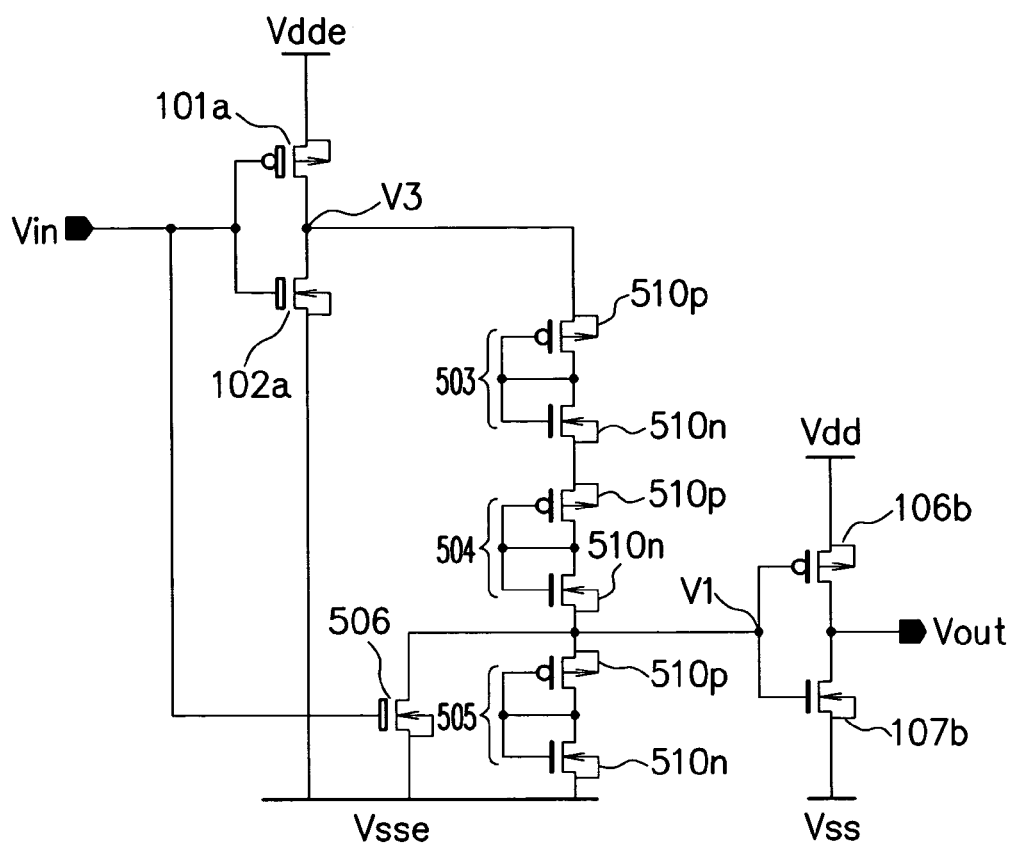
FIG. 5 is a circuit diagram which shows a configuration example of a level down converter in a second embodiment according to the present invention.

FIG. 5 is a circuit diagram which shows a configuration example of a level down converter in a second embodiment according to the present invention. In this embodiment, resistances 503 to 505 and an auxiliary voltage dividing element 506 are provided instead of the resistances 103 to 105 in the first embodiment (FIG. 1). In other points, this embodiment is the same as the first embodiment. The resistances 503 to 505 and the auxiliary voltage dividing element 506 function as voltage dividing circuit, as with the resistances 103 to 105.

The resistances 503 to 505 consist of MOS resistance units, respectively. The MOS resistance unit has a first terminal, a second terminal, a p-channel MOS transistor 510p, and a n-channel MOS transistor 510n. A source of the p-channel MOS transistor 510p is connected to a first terminal, and a gate and a drain thereof are connected each other. A source of the n-channel MOS transistor 510n is connected to a second terminal, and a gate and a drain thereof are connected to the gate and the drain of the p-channel MOS transistor 510p. To be more specific, parts in which the p-channel MOS transistor 510p is diode-connected, and a back gate thereof is connected to the source of the transistor 510p, and parts in which the n-channel MOS transistor 510n is diode-connected, and a back gate thereof is connected to the source of the transistor 510n, are serially connected, and thereby a resistance unit is formed.

The three MOS resistance units 503 to 505 are serially connected between an output terminal V3 and a reference potential Vsse. An input terminal V1 is connected to the node of the interconnection point for the MOS resistance units 504 and 505. A resistance-divided voltage of the voltage of the output terminal V3 is applied to the input terminal V1, as is the case with the first embodiment.

Both the transistors 510p and 510n can be either transistors having thin gate oxide films (refer to FIG. 4B) or transistors having thick gate oxide films (refer to FIG. 4A). When the gate oxide films are thick, the transistors 510p and 510n can have gate oxide films as the same film thickness as the transistors 101a and 102a. On the contrary, if the gate oxide films are thin, the transistors 510p and 510n can have gate oxide films as the same film thickness as the transistors 106b and 107b.

In case when the fast operation of the level down converter is desired, a transistor having a thin gate oxide film will be adopted. The reason for this is because in case when a transistor has a thin gate oxide film, the absolute value of the threshold voltage Vthb is low, and therefore it is possible to reduce the transition time of the input terminal V1 to change the voltage from 0 (zero) V to 1.1 V, by decreasing the effective resistance value.

In case when the low power consumption of the level down converter is desired, on the contrary with the above, a transistor having a thick gate oxide film will be adopted, and decrease the current value between the power supply voltage Vdde and the reference potential Vsse, by increasing the effective resistance value.

In the MOS resistance units 503 to 505, the diode-connected p-channel MOS transistor and the diode-connected n-channel MOS transistor are serially connected. Hereby, even when characteristics between the p-channel MOS transistor and the n-channel MOS transistor have dispersions, resistance divided values in itself may not have dispersions, because each MOS resistance unit has a uniform dispersion.

When the resistance value of the p-channel MOS transistor 510p is "Rp", the resistance value of the n-channel MOS transistor 510n is "Rn", and the voltage of the output terminal V3 is "Vv3", the voltage "Vv1" of the input terminal V1 can be expressed by the following expression.

$$Vv1 = \frac{(Rp+Rn)}{(Rp+Rn)+(Rp+Rn)+(Rp+Rn)} \times Vv3 \qquad \text{[Expression 2]}$$
$$= \frac{1}{3} \times Vv3$$

When the characteristic of the p-channel MOS transistor 510p has a dispersion, and the resistance value of the transistor 510p ranges to (Rp+ARp), the voltage Vv1 of the input terminal V1 will be expressed by the following expression, because the same type MOS transistor 510p will has a uniform dispersion.

$$Vv1 = \frac{(Rp+ARp+Rn)}{(Rp+ARp+Rn)+} \times Vv3 \qquad \text{[Expression 3]}$$
$$(Rp+ARp+Rn)+$$
$$(Rp+ARp+Rn)$$
$$= \frac{1}{3} \times Vv3$$

As described above, even if the transistor 510p has a dispersion, the voltage Vv1 of the input terminal V1 will not range and stay in the same value.

Besides, the MOS resistance units 503 to 505 can consist of only the diode-connected p-channel MOS transistor, or the diode-connected n-channel MOS transistor, respectively. Even then, the negative impact caused by the process dispersions can be restrained.

The back gates of the MOS resistance units 503 to 505 are connected to the sources of respective transistors 510p and 510n. Thereby, the back bias effects of transistors will appear uniformly, and dispersions in resistance values between each MOS resistance unit becomes rare to appear.

When the gate oxide films of the transistors 510p and 510n are thin, it is necessary to adjust the number of rows of serially connected MOS resistance units and limit the voltage within the allowable voltage Vgs of respective transistors 510p and 510n, not to break the gate oxide films. To be more specific, by decreasing the number of rows of connected MOS resistance units, the voltage Vgs of each transistor becomes high, and by increasing the number of rows connected, the voltage Vgs of each transistor becomes low.

Next, the auxiliary voltage dividing element 506 is described. The auxiliary voltage dividing element 506 is a n-channel MOS transistor having a thick gate oxide film. A gate of this auxiliary voltage dividing transistor 506 is connected to the input terminal Vin, a source thereof is connected to the reference potential Vsse, and a drain thereof is connected to the input terminal V1. A high voltage of from 0 (zero) V to 3.3 V are inputted to the input terminal Vin, and the voltage is applied to the gate of the auxiliary voltage dividing transistor 506, therefore, by disposing a thick gate oxide film, the break down of the gate oxide film can be restrained. The film thickness of the gate oxide film can be the same film thickness of the gate oxide films of the transistors 101a and 102a. The auxiliary voltage dividing transistor 506 has a function to change the voltage of the input terminal V1 from 1.1 V to 0 (zero) V certainly.

As shown in FIG. 6, when the input terminal Vin becomes 0 (zero) V, the auxiliary voltage dividing transistor 506 is turned off, and the output terminal V3 of the front stage inverter becomes 3.3 V. The input terminal V1 of the rear stage inverter becomes 1.1 V as with the first embodiment. And the output terminal Vout becomes 0 (zero) V.

On the contrary, when the input terminal Vin becomes 3.3 V, the auxiliary voltage dividing transistor 506 is turned on, and the output terminal V3 of the front stage inverter becomes 0 (zero) V. The input terminal V1 of the rear stage inverter is connected to the reference potential Vsse (0 V) through the auxiliary voltage dividing transistor 506, and becomes 0 (zero) V certainly. And the output terminal Vout becomes 1.2 V.

Next, the reason why the auxiliary voltage dividing transistor 506 is required is described. At first, the operation without the auxiliary voltage dividing transistor 506 (the case when only the MOS resistance units 503 to 505 are used) is described hereafter. As described above, when the output terminal V3 of the front stage inverter becomes 3.3 V, the input terminal V1 becomes 3.3÷3=1.1 V, and the voltage can be inputted to the rear stage inverter.

However, when the output terminal V3 of the front stage inverter becomes 0 (zero) V, the MOS resistance unit 505 uses the diode-connected MOS transistors 510p and 510n as resistances, and it is therefore different from an ordinary resistance element, the voltage Vgs thereof does not become 0 (zero) V and remains in the threshold voltage Vthb, and so on, even if the current Ids does not flow (refer to FIG. 3A). In the MOS resistance unit 505, when the threshold voltage of the n-channel MOS transistor 510n is "Vthn", and the absolute value of the threshold voltage of the p-channel MOS transistor 510p is "Vthp", the voltage "Vv1" of the input terminal V1 can be expressed by the following expression.

$$Vv1 = Vthn + Vthp$$

Under normal circumstances, the voltage Vv1 should be 0 (zero) V, but it becomes to the predetermined positive voltage value, as shown in the above expression. This may cause the malfunction of the rear stage inverter. Therefore, by disposing the auxiliary voltage dividing transistor 506, the voltage Vv1 of the input terminal V1 can be set as 0 (zero) V certainly. To be more specific, when the input terminal Vin becomes 3.3 V, the auxiliary voltage dividing transistor 506 is turned on. The input terminal V1 of the rear stage inverter is connected to the reference potential Vsse (0 V) through the auxiliary voltage dividing transistor 506, and becomes 0 (zero) V certainly. As a result, the output terminal Vout becomes 1.2 V normally.

On the contrary, when the input terminal Vin becomes 0 (zero) V, if the auxiliary voltage dividing transistor 506 is turned on, the voltage value of the input terminal V1 does not become the normal value of 1.1 V. Therefore it is necessary to turn off the auxiliary voltage dividing transistor 506. The gate of the auxiliary voltage dividing transistor 506 is connected to the input terminal Vin, therefore it is possible to turn off the auxiliary voltage dividing transistor 506 when the input terminal Vin is 0 (zero) V. Hereby, it is possible to perform the normal operation even when the input terminal Vin is 0 (zero) V.

As described above, according to the first and the second embodiments, a level down converter which has a first and a second inverters is provided. The first inverter is supplied a first power supply voltage Vdde (for example, 3.3 V), and outputs the input signals which are made by a logical inversion, and the second inverter is supplied a second power supply voltage Vdd (for example, 1.2 V) which is lower than the first power supply voltage, and outputs the output signals from the first inverter, which are made by a logical inversion. The first inverter contains transistors 101a and 102a which have gate insulation films having a first film thickness. The second inverter contains transistors 106b and 107b which have gate insulation films having a second film thickness which is thinner than the first film thickness. Hereby, even when the second power supply voltage Vdd is low, it is possible to turn on/off the p-channel and the n-channel MOS transistors 106b and 107b of the second inverter adequately, and make a reliable level down conversion.

The absolute value of the threshold voltage of a transistor which has a gate insulation film having a thin thickness is low, compared to a transistor which has a gate insulation film having a thick thickness. Therefore, by using a transistor which has a gate insulation film having a thin thickness for the second inverter, the absolute value of the threshold voltage of the transistor becomes low and the operation speed becomes fast. As a result, the deterioration of the duty ratio of the output signals can be restrained, even when the frequency of the input signals are high. And, the influence by the noise on the power supply or on the ground can be reduced. Further, the deterioration of the duty ratio can be restrained even when the process has dispersion.

The level down converter according to the above mentioned embodiments can be applied to PLL (Phase Locked Loop) circuits and for cellular phones.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A level down converter comprising:
   a first inverter supplied with a first power supply voltage, containing at least one first transistor including a gate insulation film having a first film thickness, and outputting signals made by logical inversions of input signals;
   a second inverter supplied with a second power supply voltage being lower than said first power supply voltage, containing at least one second transistor including a gate insulation film having a second thickness which is thinner than said first film thickness, and outputting signals made by logical inversions of output signals from said first inverter; and
   a voltage dividing circuit dividing an output voltage of said first inverter and supplying the divided output voltage to an input of said second inverter.

2. The level down converter according to claim 1, wherein said voltage dividing circuit includes plural resistance elements serially connected to an output of said first inverter, and further comprising a node between said plural resistance elements that is connected to the input of said second inverter.

3. The level down converter according to claim 2, wherein each of said plural resistance elements is an element in which a diode-connected element of a p-channel MOS field effect transistor and a diode-connected element of an n-channel MOS field effect transistor are serially connected.

4. The level down converter according to claim 2, further comprising an auxiliary voltage dividing element making the input of said second inverter low level when the input of said first inverter is in high level.

5. The level down converter according to claim 1, wherein:
   said first inverter has a first input terminal, a first output terminal, and said at least one first transistor includes a first p-channel MOS field effect transistor including a gate insulation film having said first film thickness and a first n-channel MOS field effect transistor including the gate insulation film having said first film thickness;
   a gate of said first p-channel MOS field effect transistor is connected to said first input terminal, a source thereof is connected to said first power supply voltage, and a drain thereof is connected to said first output terminal;
   a gate of said first n-channel MOS field effect transistor is connected to said first input terminal, a source thereof is connected to a first reference potential, and a drain thereof is connected to said first output terminal;
   said second inverter has a second input terminal at said input of said second inverter, a second output terminal, and said at least one second transistor includes a second p-channel MOS field effect transistor including a gate insulation film having said second film thickness, and a second n-channel MOS field effect transistor including the gate insulation film having said second film thickness;
   a gate of said second p-channel MOS field effect transistor is connected to said second input terminal, a source thereof is connected to said a second power supply voltage, and a drain thereof is connected to said second output terminal; and
   a gate of said second n-channel MOS field effect transistor is connected to said second input terminal, a source thereof is connected to a second reference potential, and a drain thereof is connected to said second output terminal.

6. The level down converter according to claim 5, wherein said voltage dividing circuit has plural resistance elements which are serially connected between said first output terminal and the first reference potential, and a node between said plural resistance elements is connected to said second input terminal.

7. The level down converter according to claim 6, wherein a voltage supplied to said second input terminal is equal to or less than said second power supply voltage.

8. The level down converter according to claim 7, wherein: said plural resistance elements have a first terminal, a second terminal, and a MOS field effect transistor; and a gate and a drain of said MOS field effect transistor are connected to said first terminal, and a source thereof is connected to said second terminal.

9. The level down converter according to claim 8, wherein a back gate of said MOS field effect transistor is connected to a source thereof.

10. The level down converter according to claim 9, further comprising an auxiliary voltage dividing element making said second input terminal low level when said first input terminal is in high level.

11. The level down converter according to claim 10, wherein said auxiliary voltage dividing element has an a n-channel MOS field effect transistor for auxiliary purpose, and a gate of said n-channel MOS field effect transistor for auxiliary purpose is connected to said first input terminal, a source thereof is connected to said first a reference potential, and a drain thereof is connected to said second input terminal.

12. The level down converter according to claim 11, wherein said MOS field effect transistor has a gate insulation film having the same film thickness as said first film thickness.

13. The level down converter according to claim 11, wherein said MOS field effect transistor has a gate insulation film having the same film thickness as said second film thickness.

14. The level down converter according to claim 7, wherein:
   said resistance element has a first terminal, a second terminal, a p-channel MOS field effect transistor and an a n-channel MOS field effect transistor;
   a source of said p-channel MOS field effect transistor is connected to said first terminal, and a gate and a drain thereof are connected each other;
   a source of said n-channel MOS field effect transistor is connected to said second terminal, and a gate and a drain thereof are connected to the gate and the drain of said p-channel MOS field effect transistor.

15. The level down converter according to claim 14, wherein back gates of said p-channel and n-channel MOS field effect transistors are respectively connected to the sources of said p-channel and n-channel MOS field effect transistors.

16. The level down converter according to claim 15, further comprising an auxiliary voltage dividing element making said second input terminal low level when said first input terminal is in high level.

17. The level down converter according to claim 16, wherein said auxiliary voltage dividing element has an n-channel MOS field effect transistor for auxiliary purpose, and a gate of said n-channel MOS field effect transistor for auxiliary purpose is connected to said first input terminal, a source thereof is connected to the first reference potential, and a drain thereof is connected to said second input terminal.

18. The level down converter according to claim 17, wherein said p-channel and n-channel MOS field effect transistors have gate insulation films having the same film thickness as said first film thickness.

19. The level down converter according to claim 17, wherein said p-channel, and n-channel MOS field effect transistors have gate insulation films having the same film thickness as said second film thickness.

* * * * *